United States Patent [19]

North

[11] 4,397,602
[45] Aug. 9, 1983

[54] SYSTEM FOR HANDLING AXIAL LEAD COMPONENTS THAT HAVE LOW RATIO OF PARAMAGNETISM TO WEIGHT

[75] Inventor: Paul C. North, Fredonia, Pa.

[73] Assignee: GTI Corporation, San Diego, Calif.

[21] Appl. No.: 308,777

[22] Filed: Oct. 5, 1981

[51] Int. Cl.³ .................... B65G 47/06; B65B 35/00
[52] U.S. Cl. .................................. 414/415; 53/236; 198/381; 221/200
[58] Field of Search .................. 414/415–417, 414/421; 198/381, 619; 221/200, 212; 53/236, 247, 111 R, 525

[56] References Cited

U.S. PATENT DOCUMENTS

| 3,537,580 | 11/1970 | Beroset et al. | 198/619 X |
| 3,741,436 | 6/1973 | Hartline et al. | 198/331 X |
| 3,742,678 | 7/1973 | Wyatt | 198/331 X |

Primary Examiner—Robert G. Sheridan
Attorney, Agent, or Firm—Webb, Burden, Robinson & Webb

[57] ABSTRACT

System for handling axial lead components that have a low ratio of paramagnetism to weight comprising at least one nonmagnetic magazine and at least one packing and/or unpacking station for receiving the nonmagnetic magazine. The packing and/or unpacking stations receive the magazines and enable the slope of the bottom of the magazines to be adjusted to the horizon. The packing stations support two plate-like magnets along each sidewall of the magazine positioned therein for creating a magnetic field passing in and out of the sidewalls of the magazine. A vibrator is mounted to the magazine when secured to the packing and/or unpacking station to apply vibrations to it in a direction substantially aligned with the magnetic field. Axial lead components which would not be levitated in the magnetic field and would otherwise fall into the magazine in a scrambled or haystack arrangement are caused to orient and pack by the cooperation of the slope of the bottom of the magazine, the magnetic field and the vibration of the magazine.

12 Claims, 7 Drawing Figures

SYSTEM FOR HANDLING AXIAL LEAD COMPONENTS THAT HAVE LOW RATIO OF PARAMAGNETISM TO WEIGHT

BACKGROUND OF THE INVENTION

Certain types of electronic components have two axial leads extending from opposite sides of the components as, for example, with resistors and diodes. To efficiently manufacture, package, and use these components, handling systems are required. The handling systems must orient the components with parallel leads and maintain the orientation. Otherwise, it may be necessary to untangle a loosely packed assemblage (haystack) of components at each processing stage.

In the case of components which are themselves paramagnetic or have paramagnetic leads and relatively light weight, handling systems have been devised using magnetic fields to suspend (levitate) and orient the components within the magnetic field. The components are suspended with parallel leads and advance maintaining this orientation from one position to another. Handling systems for components having a low weight to paramagnetism ratio are illustrated in U.S. Pat. Nos. 3,388,795; 3,537,580; 3,581,889; and 3,941,242. In these handling systems, the axial lead components are suspended between magnetic walls in a magnetic bin. They are then picked up by a wheel that has spaced magnetic stations for receiving the components. These prior art handling systems cannot be used with heavier components or with those that are only weakly magnetic.

Entirely different systems are required for handling nonmagnetic components. No use of the magnetic field can be made to orient the components or secure them to a spacing wheel. Each component must be individually secured at each stage to maintain orientation and spacing. These systems are necessarily complex and expensive.

Certain components, however, while insufficiently paramagnetic to be handled by the lead handling systems described, as for example in the above referenced patents, do have paramagnetic properties sufficient to enable their handling in systems according to this invention, which systems are much less complicated and expensive than those devised for nonmagnetic components.

It is an object according to this invention to provide a lead handling system for paramagnetic axial lead components that cannot be suspended in magnetic bins because of their low paramagnetism to weight ratio.

SUMMARY OF THE INVENTION

Briefly according to this invention there is provided a system for handling axial lead components in nonmagnetic magazines. By axial lead component is meant a component that has lead wires extending from two opposite ends of the component with the lead wires being substantially aligned on the same axis. The components are oriented and stacked or unstacked within the magazine in an orderly fashion by a combination of three actions; namely, the action of a transverse magnetic field, the action of vibration in the transverse direction, and the action of gravity enabled by a sloping bottom in the magazine. All three of these actions combine to enable the components with a certain degree of paramagnetism to be oriented and packed into the magazine even though the components cannot be suspended in the magnetic field. The system also enables the orderly dispensing of axial lead components from the magazine through an opening located in the lower endwall of the magazine. The exact strength of the magnetic field, the exact amplitude of the vibration, and the exact slope which provide the best packing and unpacking of specific components without haystacking depend at least upon the weight and paramagnetism of the components being handled. Thus the slope of the bottom should be adjustable to enable a variety of components to be handled. Also, it is preferable to have the capability for adjusting the position of the magnets relative to the magazine to thus change the strength of the magnetic field along the length of the magazine.

Typically, a system according to this invention comprises at least one magazine and at least one packing or unpacking station. The system may comprise a plurality of magazines and packing and unpacking stations. Components are advanced in the bulk from one processing location to the next by removing a magazine from, say, a packing station (where a processing apparatus is unloaded and the magazine is packed) and then placing the magazine into an unpacking station (where the magazine is unpacked and the components are loaded onto a processing apparatus).

A magazine according to this invention comprises a box-like structure fabricated of nonmagnetic material such as aluminum or plastic. The magazine preferably has an enlongate bottom and two elongate sidewalls. The magazine has two endwalls, one of which has a gated opening adjacent the bottom. Preferably the elongate sidewalls extend beyond the gated endwall.

A packing station according to this invention comprises a magazine holder that is suspended from a frame by springs for being electromagnetically vibrated in the transverse direction. The frame is pivotally mounted so that the bottom of the magazine may be sloped to the horizon with one end lower than the other. Mounted to the frame are large permanent magnets that produce a magnetic field emerging from one sidewall and entering the other. By introducing parts at the elevated end of the magazine and adjusting the slope to say, between 15 and 30 degrees to the horizon substantially, the entire magazine can be packed with axial lead components without bunching or overflow prior to complete filling of the magazine to a given level. During packing, the magazine gate is, of course, closed.

An unpacking station according to this invention is similar to the packing station and includes additional apparatus for spacing the axial lead components emerging at the lower end of the magazine. A pick-up wheel is arranged to turn past the bottom edge of the gated end of the magazine. The pick-up wheel, which is a well-known device, turns between the extensions of the sidwalls and has an axle parallel to the lower edge of the gated endwall. Typically the axle lies in a plane including the bottom of the magazine. Since the magnetic field is not sufficiently strong to suspend the components, the bottom of the magazine must extend up to the periphery of the pick-up wheel leaving a space that does not permit passage of components. If need be, the bottom of the magazine must be extended beyond the gated endwall. The pick-up wheel has a plurality of angularly spaced stations thereon for receiving the axial lead components. Each station has associated with it, one or more magnets that pull the components to the stations on the pick-up wheel.

Preferably, according to this invention, a cylindrical brush is arranged adjacent the pick-up wheel to prevent more than one component from lodging in a given station on the pick-up wheel. The bottom of the magazine preferably is pivoted about the same axis as the axis of the pick-up wheel. Preferably, as the bottom of the magazine is moved about the pick-up wheel, the brush also moves about the pick-up wheel maintaining a fixed angular spacing from the bottom of the magazine.

THE DRAWINGS

Further features and other objects and advantages of this invention will become clear from the following description of the preferred embodiments in which FIG. 1 is a side view of an unpacking station according to this invention with the magazine removed and including an illustration of an alternate angular position of the carriage;

DESCRIPTION OF THE PREFERRED EMBODIMENTS

Figure 1:
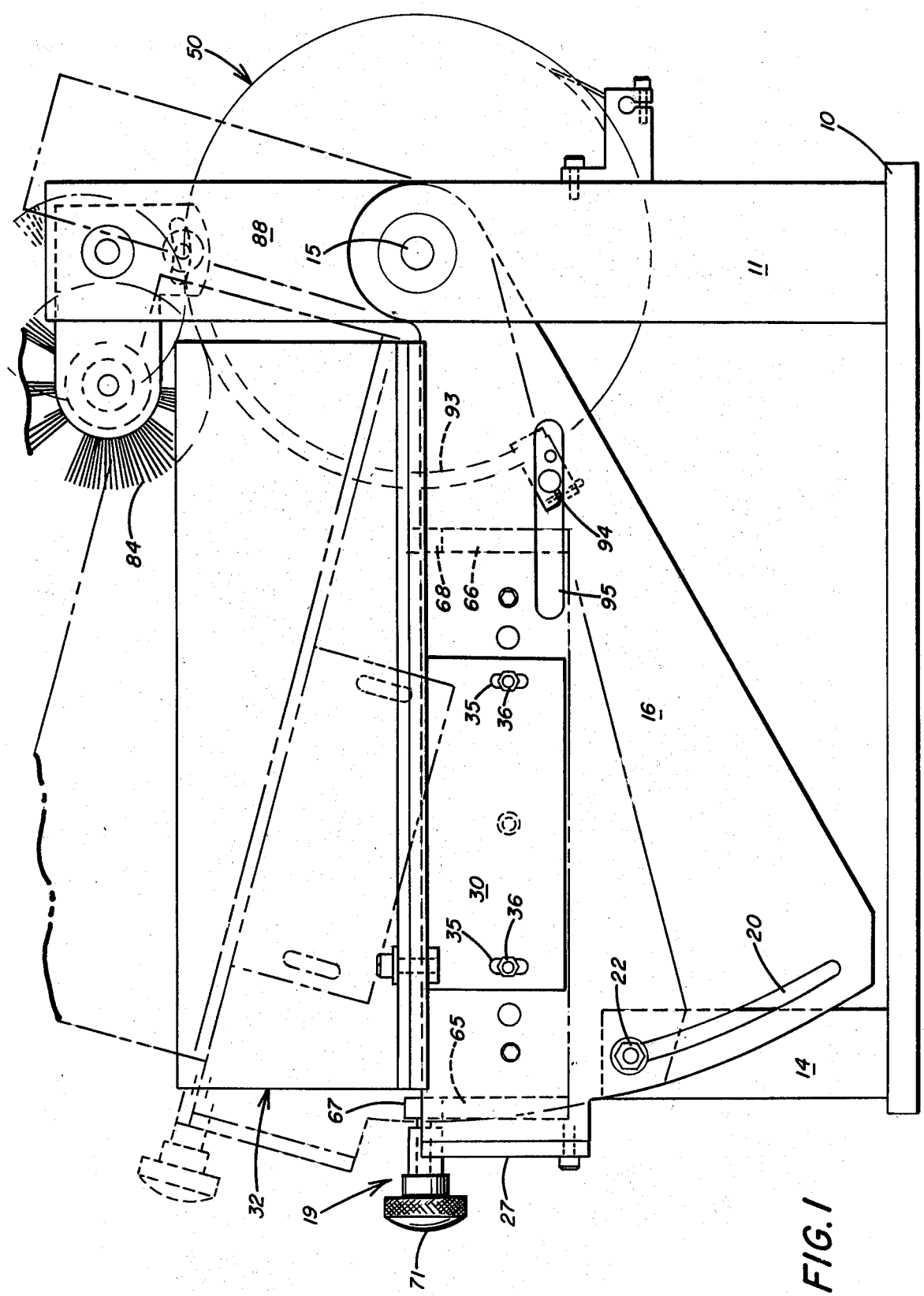
Figure 2:
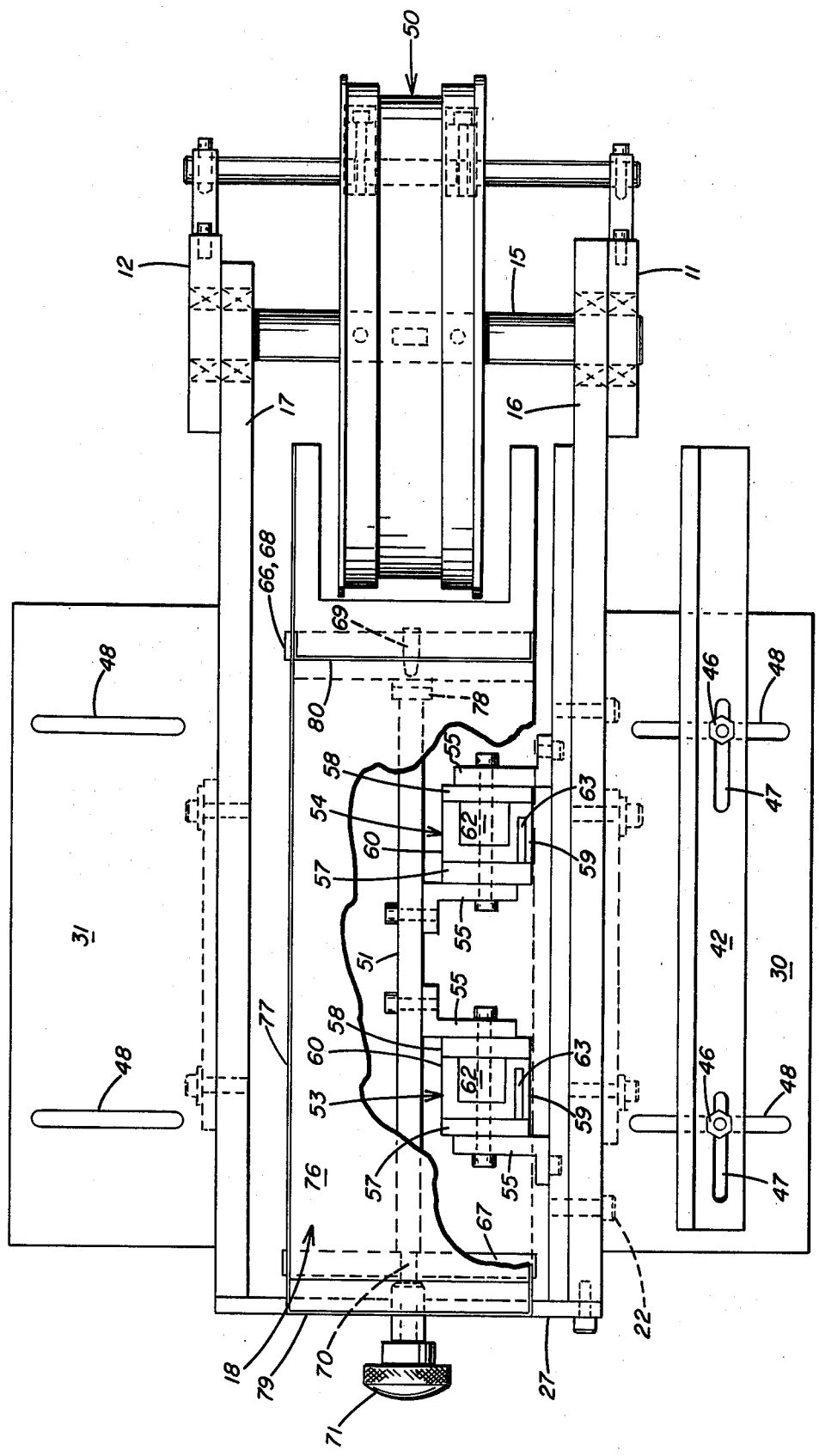
FIG. 2 is a top view of the unpacking station as shown in FIG. 1 with rotating brush and the magnets removed and the magazine broken away.
Figure 3:
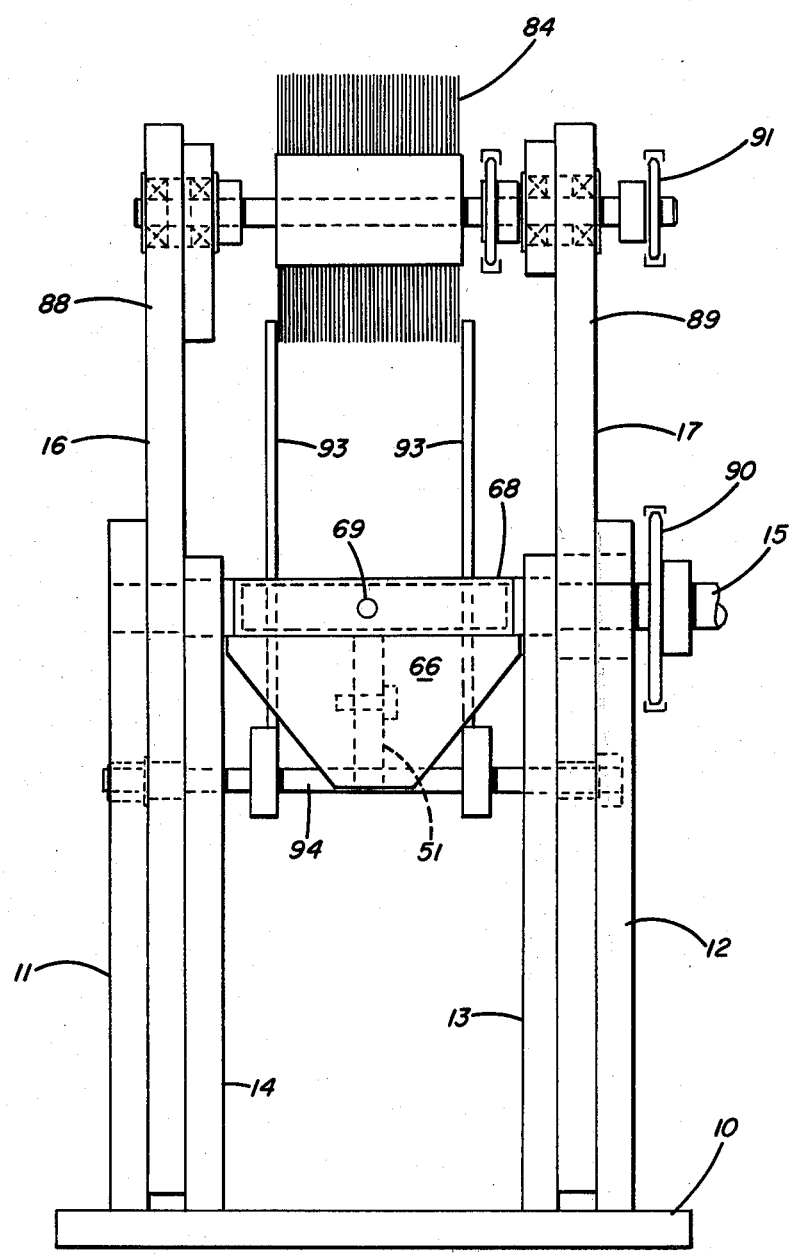
FIG. 3 is a right end view with the pick-up wheel and magnets and magnet brackets removed.
Figure 4:
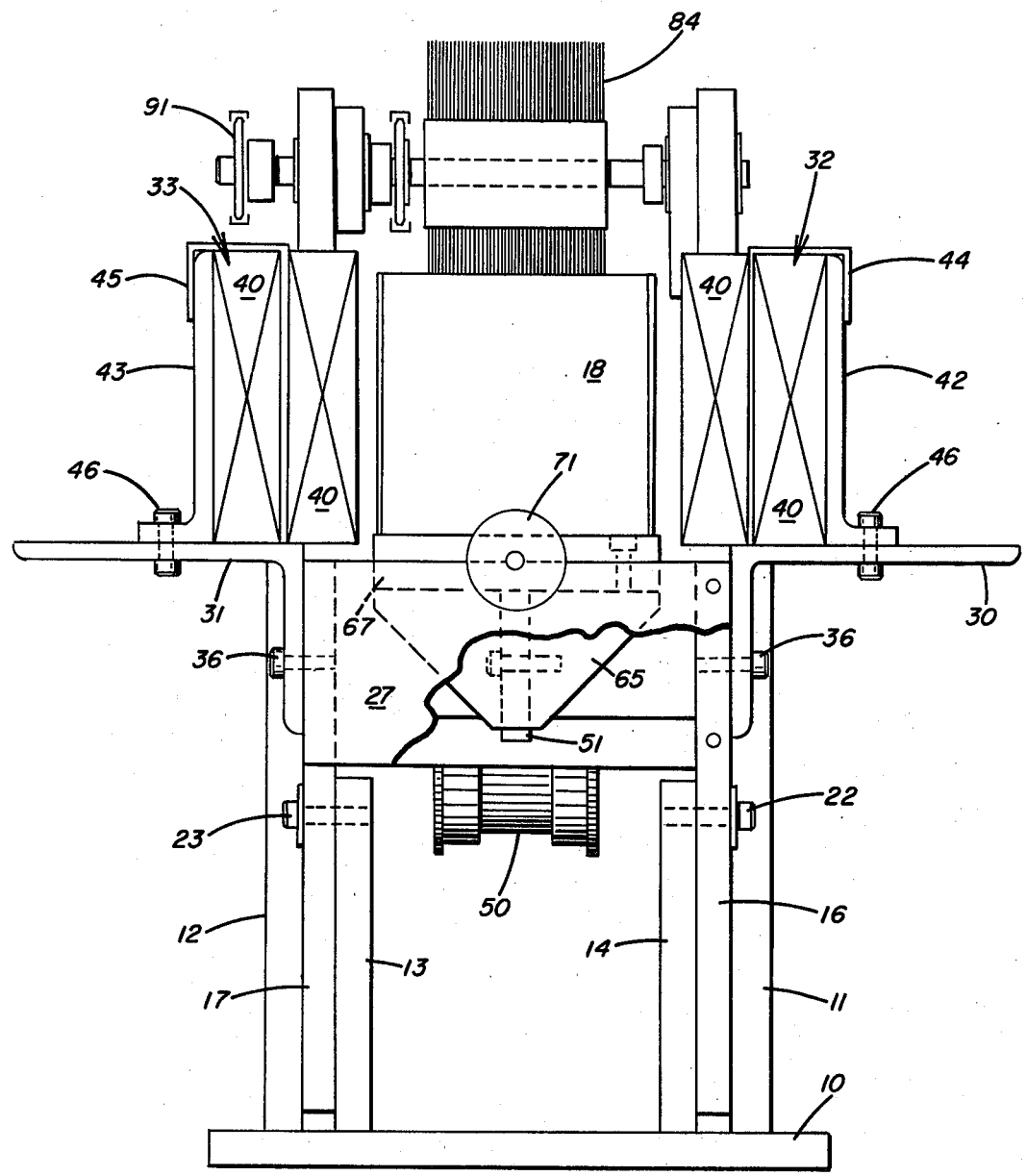
FIG. 4 is a left end view of the unpacking station.

Referring now to the FIGS. 1 to 4 the unpacking station comprises a base plate 10. Wheel shaft support standards 11 and 12 and rear adjustment standards 13 and 14 rise from the base. The main axle 15 is journaled in bearings in the support standards. Magazine carriage side plates 16, 17 are pivotally mounted to the main axle 15 at one end sliding within the two support standards 11, 12. At the other end, the side plates slide against the outer surfaces of the rear adjustment standards 13, 14. The magazine 18 may be fastened to the carriage 19 as explained hereafter. The magazine carriage side plates have arcuate slots 20 with their center of curvature at the axis of the main axle 15. Bolts 22, 23 extending from the rear adjustment standards extend outward through the arcuate slots 20. Bolts 22, 23 fix the angular position of the magazine carriage about the main axle 15. Typically, this allows the bottom of the magazine to be oriented from zero up to 30 degrees to the horizon. An alternate position of the carriage is shown in FIG. 1 with dashed lines. A tie plate 27 spans the carriage side plates at the end away from the main axial.

Adjustable magnet support angles 30, 31 are secured to the outer faces of the carriage side plates 16, 17 for supporting ceramic magnet assemblies 32, 33. The magnet support angles have slots 35 for receiving bolts 36 extending from the side plates. When the bolts 36 are tightened down the magnet support angles are fixed relative to the carriage. The upper surfaces of the support angles are positionable about a plane extending through the axes of the main axle which plane may extend through the bottom of the magazine as generally illustrated in the drawings.

The magnet assemblies comprise rectangular plate-like ceramic magnets 40 or the like secured to magnet adjustment angles 42, 43 by magnet covers 44, 45. The magnet adjustment angles are bolted to the horizontal face of the magnet support angles by nuts and bolts 46 passing through elongate slots 47 in the magnet adjustment angles 42, 43 and elongate slots 48 in the magnet support angles 30, 31. Note that the angles 42, 43 extend along most of the length of the carriage side plates. The magnets may be fabricated from barium titanate or like material. The magnets are magnetized with poles over the large faces. The magnetic poles are arranged so that a magnetic field extends from a north pole on one inside magnet face to a south pole on the inside face of the magnet on the opposite side of the magazine.

A magnetic pick-up wheel 50 is rotatably mounted on the main axle 15. The magnetic pick-up wheel is a device for spacing axial lead components that display paramagnetism in their bodies and/or leads. The pick-up wheel has a plurality of peripheral notches with equiangular spacing for receiving the axial leads. Corresponding spaces are provided to receive the component bodies. Associated with each set of peripheral notches is a permanent magnet for drawing an axial lead component into position with its leads seated in the notches. The details of the construction of the magnetic pick-up wheel are known in the art.

The magazine central support rail 51 is positioned between side plates 16, 17 and is carried by vibrators 53, 54 mounted to the inside of side plate 16. Angle brackets 55 extend between the vibrators and the central support rail and between the vibrators and the side plates. The vibrators are designed to move the central support rail in a direction perpendicular to the faces of the side plates. This is a direction more or less parallel to the axis of the main axle 15.

The vibrators have two rigid endwalls 57, 58 to which the angle brackets 55 are secured. The vibrators have flexible endwalls 59, 60. An electromagnet coil 62 is fastened to one endwall and an armature plate 63 to the other endwall in such a way that when the electromagnet is energized, its attraction to the aramature distorts the flexible vibrator sidewalls to push the rail away from one carriage sidewall. The amplitude of vibration is controlled in part by the strength of the magnetic field generated by the electromagnet, the flexibility of the vibrator sidewalls (which can be substituted) and the mass of the magazine. The frequency of vibration is typically 60 cycles per second.

Extending transverse of the center rail are two bolsters 65, 66. Wear plates 67, 68 are adjustable side-to-side over the top of the bolsters. The magazine described hereafter rests upon the top edge of the wear plates. The wear plates are preferably adjustable side-to-side to enable alignment of the components leaving the magazine with the pick-up wheel. Typically, the pick-up wheel can be adjusted for components of varying length but the adjustment causes the center plane of the pick-up wheel to change. The adjustment of the wear plates overcomes any misalignment caused by adjusting the pick-up wheel for a different size component.

The wear plate 68 nearest the pick-up wheel 50 has a centering pin 69 typically extending along the axis of the center rail and parallel therewith. The wear plate remote from the pick-up wheel has a bolt 70 typically extending along the axis of the center rail and parallel therewith also. A clamp handle 71 is threadably secured to the bolt 70.

The magazine 18 is a rectangular box-like structure fabricated from nonmagnetic material, for example sheet aluminum or plastic. The magazine has an elongate bottom 76 and elongate sidewalls 77, 78. The magazine has a closed endwall 79 and a gated endwall 80. The gated endwall has an opening near the bottom through which axial lead components may be removed. Preferably, the sidewalls extend past the gated endwall. When the magazine is in place on an unpacking station, the magnetic field extends beyond the endwall. Thus, to keep components in place as they are being mounted on the magnetic pick-up wheel 50, the extensions of the sidewall are required. The bottom may be extended beyond the gated endwall so that it terminates adjacent the pick-up wheel. The space between the edge of the bottom and the pick-up wheel must not permit a component to fall therethrough. The gated endwall 80 of the magazine has a sliding gate for closing the opening adjacent the bottom. The gate may simply be a sliding nonmagnetic plate that is folded over to clamp upon the endwall 80.

Preferably, the magazine has two transverse flanges extending underneath its bottom. The flanges are spaced so that each can abut a different wear plate on the side of the wear plate away from the pick-up wheel. One flange has a hole therein for engaging the centering pin 69 extending from a wear plate. The other flange has a slot therein to pass over the bolt 70 extending from the other wear plate. By turning down the clamp handle 71, the magazine 18 is gripped to the wear plates. Magazines are easily removed and installed by loosening and tightening the clamp handle. When installed, the vibration of the center post 51 is transferred to the magazine 18.

Secured to magazine carriage side plates 16, 17 and extending upward are brush support posts 88, 89. Journaled between extensions from the posts is a cylindrical brush 84. The brush turns in a direction opposite the pick-up wheel 50 and drags its bristles across the surface of the pick-up wheel. If a component is fixed to the wheel at other than a desired location or more than one component resides at one location, the brush will remove the out-of-place component returning it to near the gate of the magazine.

Sprockets 90, 91 are provided for driving the pick-up wheel and cylindrical brush respectively. The motors and drives are not shown in the drawings. Applicants have driven both sprockets from the same motor but find that it is preferable to provide each with its own motor as otherwise it is difficult to drive the brush at an adequate speed.

To enable the pick-up wheel to be run when the magazine is at least partially full and yet not to load the pick-up wheel has anti-feed rail 93 fastened to a rod 94 that spans the sidewalls of the magazine carriage and is journaled therein. A lever 95 is fixed to the rod 94 and enables rotation of the rod to carry the anti-feed rail 93 either into or out of position along the circumference of the pick-up wheel 50 to prevent components from seating in the notches on the pick-up wheel.

Figure 5:
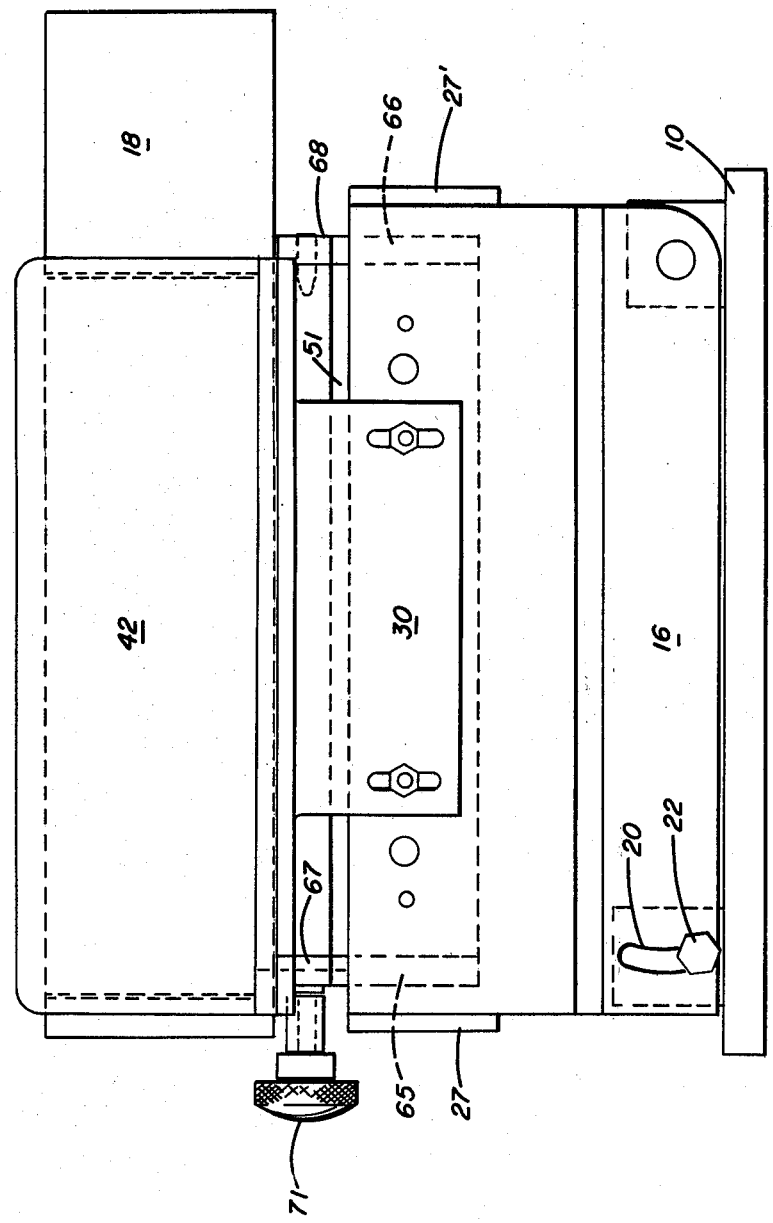
FIG. 5 is a side view of a packing station according to this invention with the magazine in place.
Figure 6:
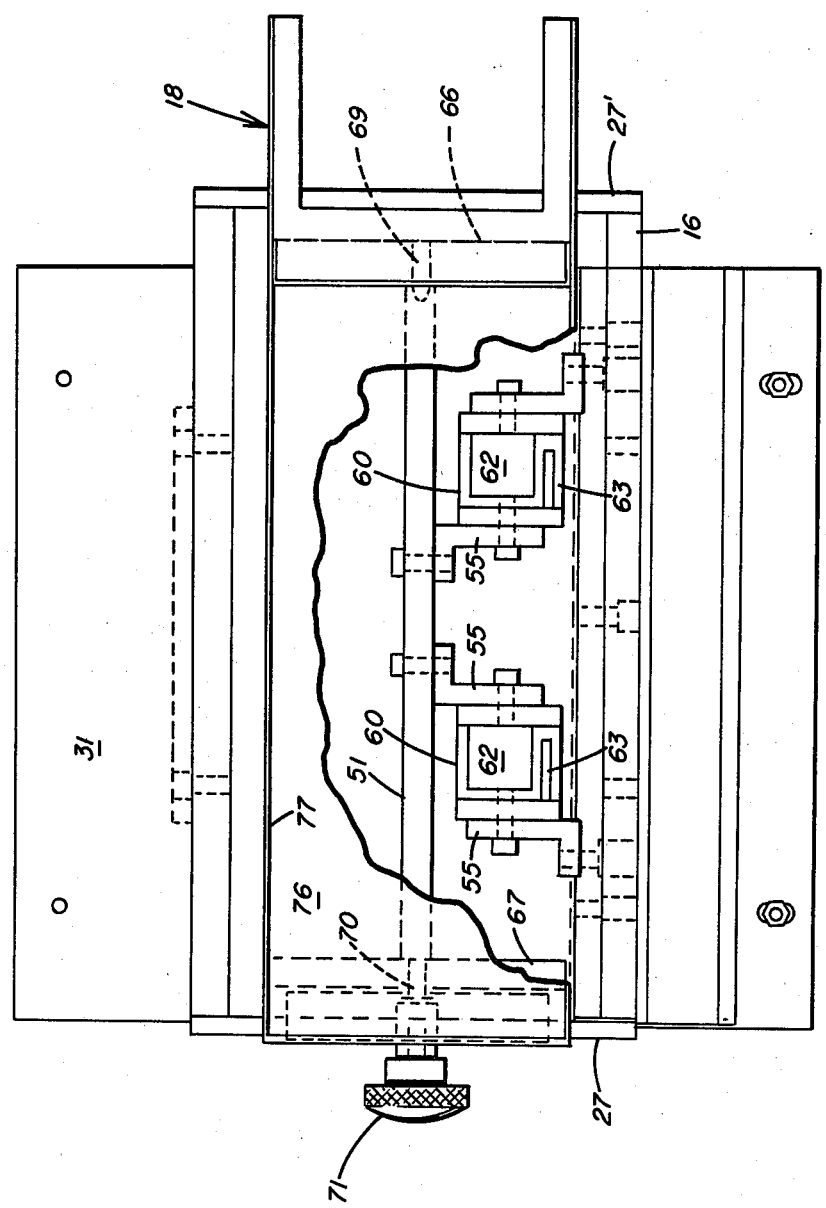
FIG. 6 is a top view of the packing station of FIG. 5 with the magazine bottom broken away.
Figure 7:
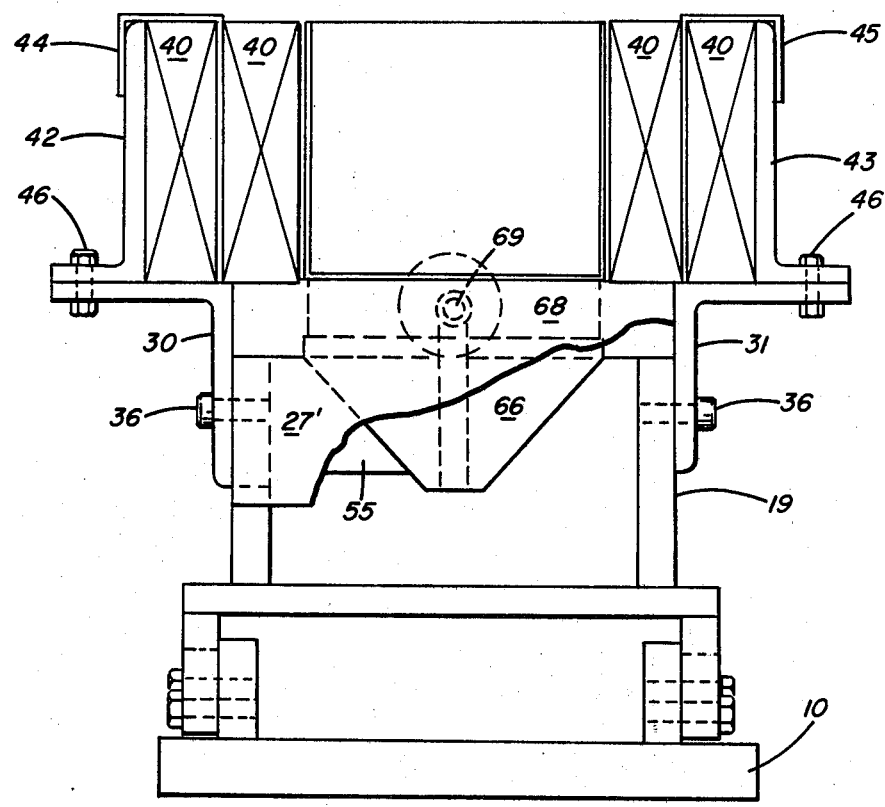
FIG. 7 is a right end view of the packing station of FIG. 5 with the magazine in place.

The packing station shown in FIGS. 5, 6, and 7 is much simpler than the unpacking station shown in FIGS. 1, 2, 3, and 4; however, the structure is very similar. The common elements of the packing station shown in FIGS. 5, 6, and 7 are given like reference numbers to those described with reference to FIGS. 1, 2, 3, and 4. The base of the packing station is rotated to change the slope of the bottom of the magazine but not about an axis lying near the plane of the magazine bottom.

OPERATION

Associated with each apparatus for processing axial lead components is a packing and/or unpacking station. A magazine filled with axial lead components is secured to the center rail of the unpacking station and the gate is opened. The slope of the magazine bottom is adjusted by adjusting the magazine carriage to obtain the best results for the particular components being dispensed. The slope is always downward toward the gate and is adjusted from more than zero to between about 15 and 30 degrees to the horizontal plane.

An empty magazine with the gate closed is mounted on the center rail of the packing station. The slope of the bottom of the magazine is adjusted from more than zero to between about 15 and 30 degrees to the horizontal plane. The packing station is arranged so that the axial lead components will drop onto the high end of the magazine.

The packing and unpacking stations according to this invention are for use with axial lead components that are paramagnetic but will not be levitated in the magnetic field. Without the application of vibration, these components would haystack in the magazine and would not neatly pack at the packing station or feed from the magazine at the unpacking station. Moreover, it is essential that the vibration be more or less transverse of the magazine, i.e., along the axis of the components and their leads. Applicants found that longitudinal vibration of the magazine will not work. In fact, it causes haystacking.

Having thus described the invention with the detail and particularly required by the Patent Laws, what is desired protected by Letters Patent is set forth in the following claims.

I claim:

1. A system for handling axial lead components having a low ratio of paramagnetism to weight comprising:
    at least one box-like magazine having a bottom, two sidewalls and two endwalls, said magazine having a transverse dimension between sidewalls just greater than the length of the components and their leads, said magazine having a gated opening near the bottom edge of one endwall; and
    at least one station comprising a frame, means for releasably fastening a magazine to said frame, said frame having a vibrator attached thereto to provide vibration to a magazine fastened thereto, said vibration along the transverse dimension of the magazine, two magnets mounted to said frame arranged on opposite sides of a magazine fastened thereto to provide a magnetic field within said magazine along the transverse dimension, and means for tilting the frame about an axis generally parallel to the transverse dimension to change the attitude of the bottom of the magazine.

2. A system according to claim 1 wherein at least one station comprises a packing station, said packing station having a frame tilted to place one end of the magazine higher than the other and said packing station positioned for the magazine to receive axial lead components near its upper end.

3. A system according to claim 1 wherein at least one station comprises an unpacking station, said unpacking station having a frame having a magnetic pick-up wheel at one end positioned to receive axial lead components emerging from the opening in the gated endwall, said frame being tilted to place the gated endwall of the magazine lower than the other endwall of the magazine.

4. A system according to claim 1 wherein the magazine has extensions of the sidewall beyond the gated endwall.

5. An unpacking system for dispensing and spacing axial lead components having a low ratio of paramagnetism to weight comprising:
   at least one box-like magazine having a bottom, two sidewalls and two endwalls, said magazine having a transverse dimension between the sidewalls just greater than the length of the components and their leads, said magazine having a gated opening near the bottom edge of the one endwall; and
   a frame pivotally mounted for angular positioning about said main axle, a magnetic pick-up wheel also pivotally mounted on said main axle and arranged to be driven in rotation, means for releasably fastening a magazine to said frame with the gated opening adjacent the periphery of the pick-up wheel and with the opening generally parallel to the axis of the main axle, said frame having a vibrator attached thereto to provide vibration to a magazine fastened thereto, said vibration along the transverse dimension of the magazine, two magnets mounted to said frame arranged on opposite sides of the magazine fastened thereto to provide a magnetic field within the magazine along the transverse direction.

6. An unpacking station according to claim 5 having a brush roll mounted to the frame to be driven in a direction opposite of the pick-up wheel with the bristles of the brush wheel dragging over the surface of the pick-up wheel substantially above the gated opening in the endwall of the magazine.

7. An unpacking station according to claim 5 in which the at least one magazine has extensions of the sidewalls beyond the gated endwall and the magazines attached to the frame are arranged to extend along the sidewalls of a magazine fastened thereto and beyond the gated endwall, and the pick-up wheel is arranged to turn through the space between the extensions of the sidewalls of the magazine.

8. An unpacking system according to claims 5, 6, or 7 wherein the bottom of the magazine extends beyond the gated endwall to be just adjacent the periphery of the pick-up wheel such that components cannot fall between the edge of the bottom and pick-up wheel.

9. An unpacking system according to claims 5, 6, or 7 further comprising anti-feed mechanism for preventing the components from reaching the pick-up wheel.

10. An unpacking system according to claim 5 in which the frame comprises two parallel side plates journaled at one end to the main axle and a tie plate spanning the side plates remotely from the main axle, a center rail between the side plates held in place between the side plates by at least one vibrator attached to at least one side plate, bolsters fixed to said side plates for supporting the magazine, and means for releasably securing the magazine to said bolsters.

11. The unpacking system according to claim 10 wherein said vibrators comprise electromagnets.

12. The unpacking system according to claim 10 wherein said vibrators have flexible sidewalls and rigid opposite edges, said edges secured to the frame side plate and the center rail respectively.

* * * * *

UNITED STATES PATENT AND TRADEMARK OFFICE
CERTIFICATE OF CORRECTION

PATENT NO. : 4,397,602
DATED : August 9, 1983
INVENTOR(S) : Paul C. North

It is certified that error appears in the above-identified patent and that said Letters Patent are hereby corrected as shown below:

Column 6 Line 34 "particularly" should read —particularity—.

Signed and Sealed this

Fourth Day of October 1983

[SEAL]

Attest:

GERALD J. MOSSINGHOFF

Attesting Officer

Commissioner of Patents and Trademarks